United States Patent
Lee et al.

(10) Patent No.: US 9,431,309 B2
(45) Date of Patent: Aug. 30, 2016

(54) METHOD FOR WAFER LEVEL RELIABILITY

(71) Applicant: Magnachip Semiconductor, Ltd., Cheongju-si (KR)

(72) Inventors: KyeNam Lee, Cheongwon-gun (KR); HyunHo Jang, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 272 days.

(21) Appl. No.: 14/056,044

(22) Filed: Oct. 17, 2013

(65) Prior Publication Data

US 2014/0106481 A1    Apr. 17, 2014

(30) Foreign Application Priority Data

Oct. 17, 2012   (KR) .................. 10-2012-0115625

(51) Int. Cl.
  *G01R 31/26* (2014.01)
  *H01L 21/66* (2006.01)
  *H01L 27/115* (2006.01)
  *H01L 29/792* (2006.01)

(52) U.S. Cl.
  CPC .............. *H01L 22/14* (2013.01); *H01L 27/115* (2013.01); *H01L 27/11573* (2013.01); *H01L 29/792* (2013.01)

(58) Field of Classification Search
  CPC ............... H01L 29/792; H01L 27/115; H01L 27/11573
  See application file for complete search history.

(56) References Cited

U.S. PATENT DOCUMENTS

| | | | |
|---|---|---|---|
| 6,873,932 B1 | 3/2005 | Kim | |
| 7,145,191 B1* | 12/2006 | Teng | H01L 21/823807 257/288 |
| 2004/0233694 A1* | 11/2004 | Xue | G11C 16/0466 365/145 |
| 2006/0246715 A1* | 11/2006 | Chen | H01L 29/665 438/634 |
| 2007/0210376 A1* | 9/2007 | Li | H01L 29/0847 257/335 |
| 2010/0244150 A1* | 9/2010 | Bahl | H01L 29/6659 257/408 |
| 2013/0320945 A1* | 12/2013 | Kalnitsky | H02M 3/155 323/282 |

* cited by examiner

Primary Examiner — Zandra Smith
Assistant Examiner — John M Parker

(57) ABSTRACT

A method for ensuring wafer level reliability is provided. The method involves: forming a gate oxide layer having a thickness of less than 50 Å on a semiconductor substrate; forming a PMOS element having a channel length of less than 0.13 μm on the semiconductor substrate; and assessing hot carrier injection (HCI) for the PMOS element.

10 Claims, 5 Drawing Sheets

METHOD FOR WAFER LEVEL RELIABILITY

CROSS-REFERENCE TO RELATED APPLICATIONS

This application claims the benefit under 35 U.S.C. §119 (a) of Korean Patent Application No. 10-2012-0115625, filed on Oct. 17, 2012, in the Korean Intellectual Property Office, the entire disclosure of which is incorporated herein by reference for all purposes.

BACKGROUND

1. Field

The following description relates to wafer reliability, and to, for example, a method for ensuring wafer level reliability (hereinafter, abbreviated as "WLR") associated with product level reliability (hereinafter, abbreviated as "PLR") that may be used to screen for potential problems such as "offset failure" or other reliability failure problems, during a conventional product test performed as preliminary wafer level reliability (WLR) test, thereby securing a stable level of semiconductor element development and minimizing the failure rate.

2. Description of Related Art

Wafer level reliability (WLR) test is a global standard for testing reliability of a wafer. Referring to FIG. 1, items that are generally included in the wafer level reliability (WLR) test may be grouped as element characteristic test 10, gate oxide quality test 20, and a metal wiring characteristic test 30. The element characteristic test 10 includes items such as a hot carrier injection (hereinafter, abbreviated as "HCI") test 12 used for NMOS, and a negative bias temperature instability (NBTI) test 14 used for PMOS. The gate oxide quality test 20 includes items such as a gate oxide integrity (GOI) test 22 and a time dependent dielectric breakdown (TDDB) test 24. The metal wiring characteristic test item 30 includes a electron-migration (EM) test 32.

Even when a relevant element has passed a life time (L/T) specification requirement at wafer level by applying a conventional method for testing wafer level reliability, when the relevant element is placed under product level reliability (PLR) test, various reliability issues are often discovered. Theses reliability issues that are discovered during the packaging product level may slow down manufacturing or may result in high defect rate in the products.

Product level reliability (PLR) test is a reliability test performed at the packaging product level, such as high temperature operating lifetime (HTOL) test at high temperatures above about 80 degrees (for example, 125° C.). Other reliability failure includes an offset shift failure, which is a failure associated with the deterioration of characteristics of a semiconductor element. Further, additional issues with reliability that are associated with the element characteristics may be detected during the packaging product level. Many of these reliability issues cannot be detected in advance using a standardized wafer level reliability test method.

For instance, in case of an offset shift failure associated with the threshold voltage (Vth) shift in the product level reliability (PLR) test, such failure is not sufficiently closely linked with a general wafer level reliability (WLR) test method, such as HCI result in the related art). Thus, even when a relevant element has passed a reliability test in the element stage using the standard wafer level reliability (WLR) test, a lot of reliability test failures associated with the threshold voltage shift may occur during the subsequent product stage. Thus, the development of a new wafer level reliability (WLR) test capable of detecting issues associated with product level reliability (PLR) during the preliminary wafer level reliability (WLR) stage is desirable.

The HCI test 12 that are generally used involves causing an increase of threshold voltage (Vth) while electrons induced by drain induced avalanche hot carrier (DAHC) due to a horizontal field are trapped inside a gate oxide layer at the gate bias and drain interface for only an NMOS element in which electrons having higher mobility than holes are majority carriers, thereby performing the HCI test for detecting element deterioration and making a decision for pass or fail based on the specification.

However, according to the standard test, although normal HCI characteristics of a PMOS element are not assessed, test for the PMOS element is required since the effect of holes on element characteristic deterioration is large in case of a thin gate oxide and short channel device having a low ultra-thin film insulating layer (for example, less than about 30 Å). In particular, in case of a short channel device, carrier trap in the entire channel region has a significant effect on the threshold voltage shift. However, the standard wafer level reliability (WLR) test method does not take this phenomenon into consideration in determining the reliability of semiconductor elements.

Furthermore, a standard wafer level reliability (WLR) method for testing a PMOS element is the negative bias temperature instability (NBTI) test 14. The negative bias temperature instability (NBTI) test 14 is a test item for assessing the quality of a gate oxide layer at high temperatures. A carrier trap site typically located inside an oxide layer includes an interface trap charge (Qit), an oxide trap charge (Qot), a mobile charge (Qm), and a fixed charge (Qf), and holes and hydrogen trapped in Qit and Qf, which are trap sides located at the silicon and oxide interface among them, cause a failure causing an increase of the entire threshold voltage (Vth) while being diffused into the oxide layer, thereby deteriorating the element characteristics.

Accordingly, in case of an item for detecting and assessing this or a failure of threshold voltage (Vth) in the following product level reliability test, when simply assessing only a change of threshold voltage (Vth) between the gate oxide and silicon, the test is insufficient to detect a failure of threshold voltage (Vth). In particular, the shallow trench isolation that is formed to secure transistor isolation characteristics and the liner silicon nitride thin film that is applied as a material stress relaxant may cause a decrease of threshold voltage (Vth) of PMOS since there exist a lot of defect sites in which hot carriers may be trapped, thereby causing the characteristics deterioration of the element and product.

However, when the elements are assessed with only NBTI test, which is a standard wafer level reliability (WLR) test item for a PMOS element, it is possible that the potential failure associated with threshold voltage would be undetected during the element stage.

SUMMARY

In one general aspect, there is provided a method for ensuring wafer level reliability, the method involving: forming a gate oxide layer having a thickness of less than 50 Å on a semiconductor substrate; forming a PMOS element having a channel length of less than 0.13 μm on the semiconductor substrate; and assessing hot carrier injection (HCI) for the PMOS element.

A condition of gate and drain voltages may satisfy an equation, Vg=Vd=Vop, during the process of assessing hot carrier injection (HCI), wherein Vg is gate voltage, Vd is drain voltage, and Vop is operating voltage.

A source voltage may satisfy an equation, Vs=Vb, wherein Vs is source voltage, and Vb is bulk voltage.

A criterion for determining a reliability lifetime (L/T) in the HCI test may be 0.2 year.

The general aspect of the method may further involve: forming a high voltage NMOS element on a semiconductor substrate; and assessing substrate hot carrier injection (sub-HCI) for the high voltage NMOS element.

The assessing of the sub-HCI may be implemented at a condition of gate and drain voltages satisfying an equation, Vg=Vd=Vop, wherein Vg is gate voltage, Vd is drain voltage, and Vop is operating voltage.

A predetermined voltage of less than the operating voltage may be applied to a source to reduce a potential difference to a drain, wherein Vs=½ Vop, Vs is source voltage, and Vop is operating voltage.

A predetermined source voltage of 0 V and a predetermined bulk voltage that is equal to negative bias may be applied to bulk silicon (Si) to enhance a vertical field effect to the gate and bulk.

A threshold voltage (Vth) shift ratio of less than 2% may be used as a test criterion on the basis of subsequent to stress for a predetermined period of time.

The high voltage NMOS element may have an operating voltage of 10-40 V.

In another general aspect, there is provided a method for ensuring wafer level reliability, the method involving: forming a trench on a semiconductor substrate; forming a sidewall oxide layer and a liner nitride layer on the trench; filling an insulating material on the liner nitride layer; forming a PMOS element on the semiconductor substrate; and assessing hot electron induced punch through (HEIP) for the PMOS element.

The assessing of the HEIP is implemented on the basis of a threshold voltage (Vth) shift ratio less than 10%.

In another general aspect, there is provided a method for ensuring wafer level reliability, the method involving: determining whether a semiconductor element to be formed is a PMOS element or an NMOS element; and in response to a determination that the semiconductor element is a PMOS element, performing a HEIP test, a CHC test, a PMOS HCI test or a combination thereof.

The determining may further involve determining whether the semiconductor element is a high voltage NMOS element, and in response to a determination that the semiconductor element is a high voltage NMOS element, the method may further involve performing a sub-HCI test.

The determining may further involve determining whether the semiconductor element is a low voltage PMOS element, and in response to a determination that the semiconductor element is a low voltage PMOS element, the PMOS HCI test may be performed among the HEIP test, the CHC test and the PMOS HCI test.

Other features and aspects may be apparent from the following detailed description, the drawings, and the claims.

Figure 1:
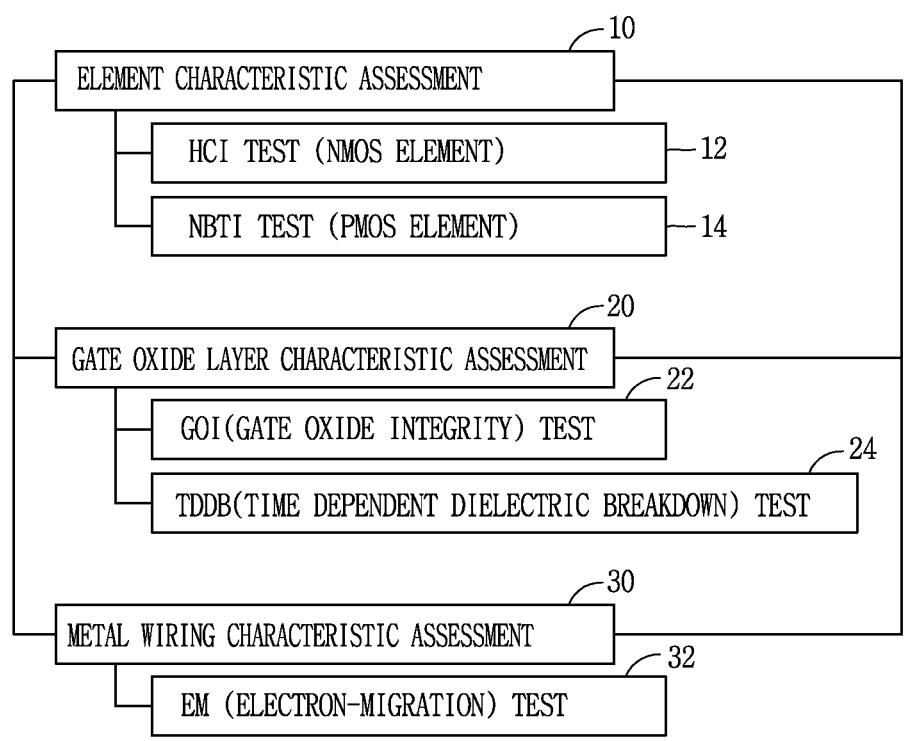
FIG. 1 is a chart illustrating a wafer level reliability test method for explaining a wafer level reliability (WLR) reinforcement method.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

Figure 2:
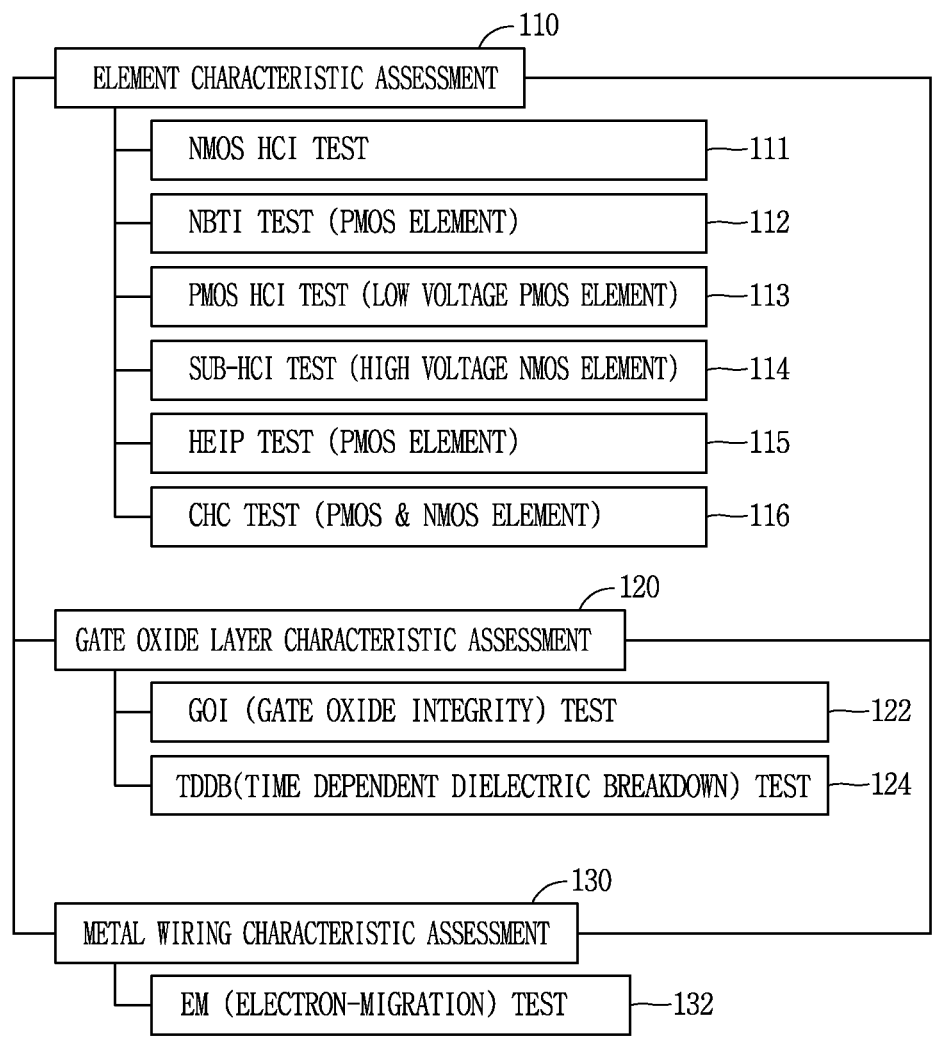
FIG. 2 is a chart illustrating an example of a wafer level reliability test method according to the present disclosure.

FIG. 2 includes a chart illustrating an example of a wafer level reliability test method for explaining a wafer level reliability detection reinforcement method according to the present disclosure.

Figure 3:
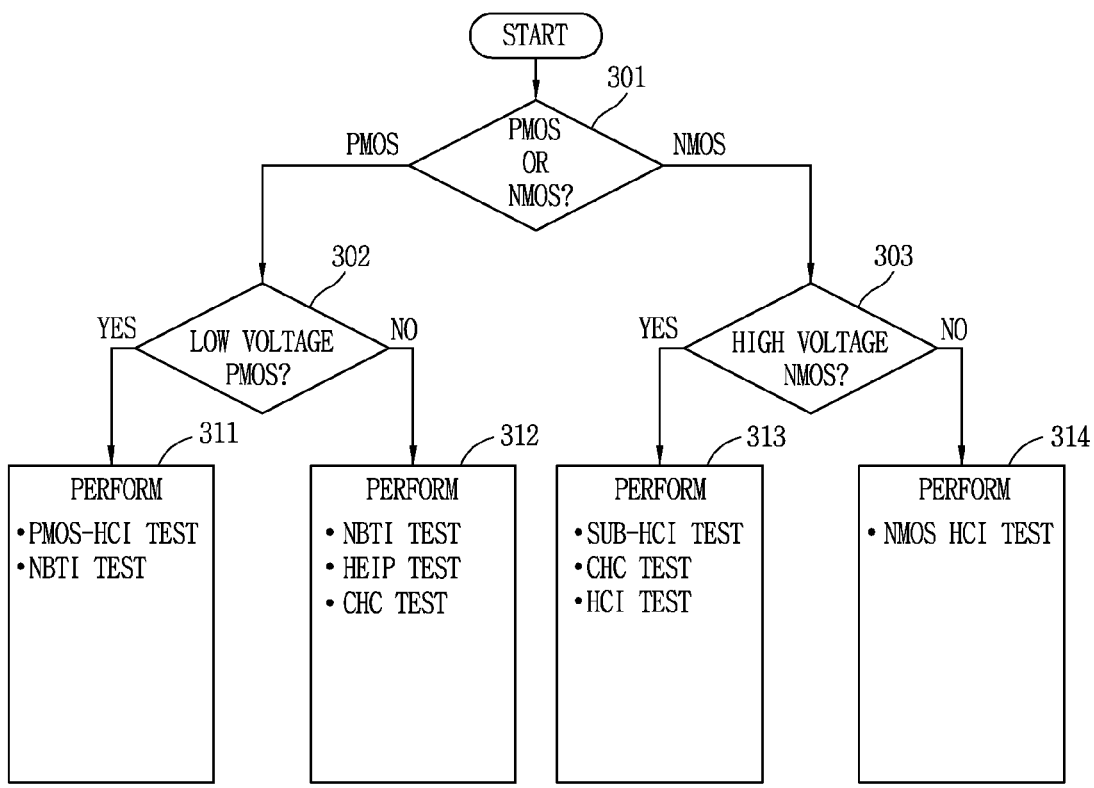
FIG. 3 is a flow chart illustrating an example of a wafer level reliability test method according to the present disclosure.

FIG. 3 includes a flow chart illustrating an example of a wafer level reliability test method for explaining a method of assessing element characteristics according to the present disclosure.

Figure 4:
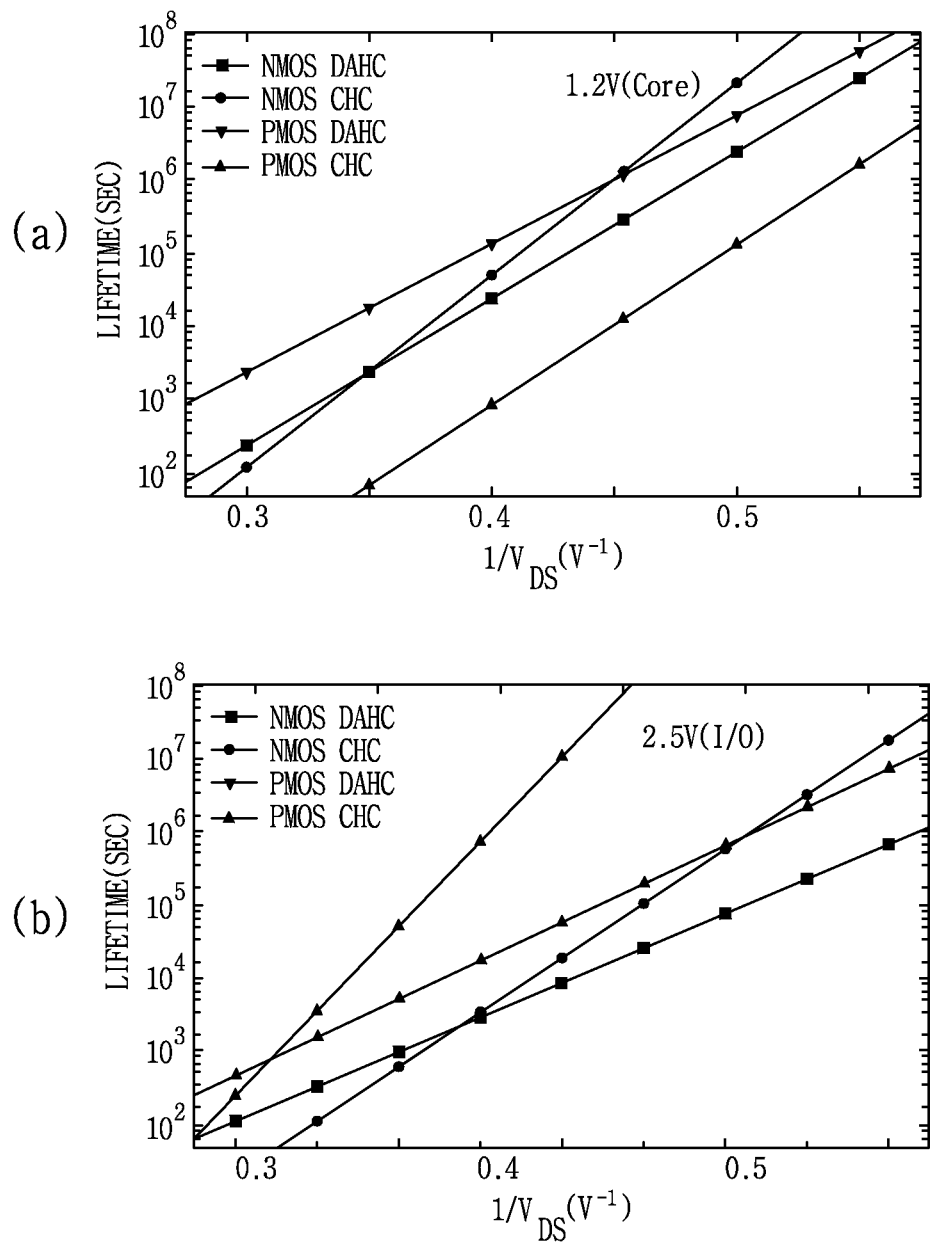
FIG. 4 is a graph illustrating a change in lifetime based on HCI characteristics of a PMOS element in an example of a wafer level reliability reinforcement method according to the present disclosure.

FIG. 4 includes graphs illustrating the change in a lifetime based on HCI characteristics of a PMOS element in an example of a wafer level reliability detection reinforcement method according to the present disclosure.

Figure 5:
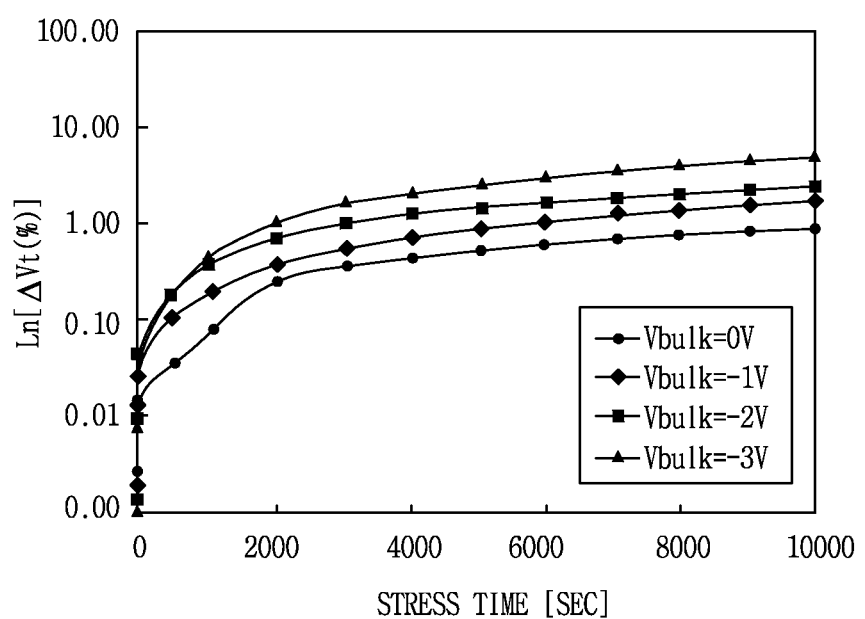
FIG. 5 is a graph illustrating a change of threshold voltage (ΔVth) shift based on a stress time in the substrate HCI item test in a wafer level reliability reinforcement method according to the present disclosure.

FIG. 5 illustrates a graph illustrating a change of threshold voltage (ΔVth) shift based on a stress time in the substrate HCI test in a wafer level reliability detection reinforcement method according to the present disclosure.

Referring to FIG. 2, an example of a method of ensuring wafer level reliability according to the present disclosure may include element characteristic assessment 110, gate oxide layer characteristic assessment 120, and metal wiring characteristic assessment 130. The element characteristic assessment 110 may involve various tests, including a hot carrier injection (HCI) test 113 used for testing a low voltage PMOS element, a substrate hot carrier injection (sub-HCI) test 114 used for testing a high voltage NMOS element, a hot electron induced punch through (HEIP) test 115, and a channel hot carrier (CHC) test 116 used for a PMOS element and a NMOS element. The gate oxide layer characteristic assessment 120 may involve various tests, including an assessment of gate oxide integrity by a gate oxide integrity (GOI) test 122, and a time dependent dielectric breakdown (TDDB) test 124. The metal wiring characteristic assessment 130 may include an electron-migration (EM) test 132.

Here, in case of a low voltage PMOS element with an operating voltage of 1-5 V, according to the related art, test has been carried out only for an NMOS element to detect an effect of element characteristics deterioration by hot carriers on the element from the process of wafer level reliability (WLR). However, as the thickness of a gate oxide layer decreases, in particular, in case of a silicon nitrided oxide (NO) film into which nitrogen applied to enhance a margin to the FN tunneling effect is infiltrated, and in case of a PMOS element having holes with a low mobility as majority carriers over the entire effective channel length (Leff) as decreasing the channel length, a threshold voltage shift problem is caused by holes trapped in the entire gate oxide layer. Thus, a PMOS HCI test 113 is added to test a low voltage PMOS element to detect a potential offset voltage shift failure problem that may occur subsequently in the product level.

Furthermore, in case of a high voltage NMOS element having an operating voltage of 10-40 V, according to the related art, threshold voltage (Vth) shift characteristic test by hot carriers has been merely checked such that electrons having a high mobility among electron-hole pairs created by a horizontal field direction in the gate channel causing drain induced avalanche hot carriers are trapped inside a gate oxide layer between the gate and drain to cause a threshold voltage (Vth) shift problem. However, in case of an offset voltage shift that is a failure produced due to the threshold voltage shift at the actual product level, since electrons are trapped at the entire surface of the gate oxide layer to cause a threshold voltage shift problem due to a vertical field between the gate electrode and silicon substrate based on silicon bulk concentration, the sub-HCI test 114 is additionally assessed to detect such a failure in advance, thereby detecting a threshold voltage shift failure caused by a vertical field of the transistor during process of the wafer level reliability (WLR) test implemented in advance.

Furthermore, in case of a high voltage PMOS element, according to the related art, it is merely the negative bias temperature instability (NBTI) item, namely, detecting that holes induced into the gate oxide layer from silicon by applying a negative bias to the gate at high temperatures are trapped inside the gate oxide layer, thereby causing an increase of threshold voltage, Vth. There is no item capable of detecting a threshold voltage shift failure problem caused by hot carriers between shallow trench isolation (STI), which is an isolation layer, and bulk silicon. Thus, according to the present disclosure, the hot electron induced punch through (HEIP) test 115, and channel hot carrier (CHC) test 116 are added during the process of wafer level reliability (WLR) test, thereby detecting a problem of lowering the threshold voltage caused by electrons trapped in the silicon nitride layer during the process of wafer level reliability (WLR) test.

The process of detecting wafer level reliability according to the present disclosure in which the hot carrier injection (HCI) test 113 for a low voltage PMOS element, and the substrate hot carrier injection (sub-HCI) test 114, hot electron induced punch through (HEIP) test 115 and channel hot carrier (CHC) test 116 are added to a wafer level reliability (WLR) test will be described below in detail.

During the performance of a hot carrier injection (HCI) test 113 in a wafer level reliability detection method according to the present disclosure, majority carriers are holes. Thus, gate and drain voltages are set in the same or similar manner ($Vg=Vd$; here, $Vd$ stress$=Vop,\max \times 1.1$), contrary to a condition of the gate voltage (Vg) and drain voltage (Vd) during the NMOS HCI test in the related art. For example, the conditions can be described with the following equations.

$$Vg = Gm,\max \; (Gm \text{ is transconductance})$$

$$Vop \times 1.1 < Vd \text{ stress} < V\text{snapback} \times 0.85.$$

The 10% change trend of a drain saturation current (Ids) due to the stress until a predetermined period of time (for example, 10,000 seconds) is calculated, and then a degradation time at the voltage of 1.1×operating voltage (Vop) (1.1 Vop) is linearly fit to assess the HCI lifetime (L/T).

For example, in case of PMOS HCI, the gate and drain voltages are the same or similar (for example, $Vg=Vd=Vop$, $Vs=Vb=0$ V), and the reliability lifetime (L/T) test criterion is the same as NMOS (greater than about 0.2 years). In this example, Vb is a bulk voltage applied to the substrate, and Vs is a voltage applied to the source region.

Accordingly, in case of a PMOS element, the gate current is greater than an NMOS element, and the effect of a vertical field due to the gate voltage is large. Thus, the gate and drain voltages are preferably assessed in the same or similar condition (for example, $Vg=Vd$ condition).

Furthermore, in case of a high voltage NMOS element in a wafer level reliability detection method according to the present disclosure, a threshold voltage (Vth) shift trend is assessed and detected during the process of wafer level reliability (WLR) based on the trap of electron carriers into the gate oxide layer due to a vertical field applied to the side of silicon from the gate according to a silicon bulk concentration, thereby detecting an offset voltage shift failure at the high temperature operating lifetime (HTOL) which is a product level reliability (PLR) in advance.

In other words, in case of the NMOS HCI test item in the related art, the degradation of an element by carriers trapped inside the gate oxide layer is detected when electrons are moved into the gate polysilicon and gate oxide layer by a gate to which a positive voltage is applied due to the creation of electron-hole pairs caused by drain induced avalanche hot carrier (DAHC) by a horizontal field. However, according to the present disclosure, the sub HCI test item 114 for detecting carrier trap inducement and threshold voltage (Vth) shift due to a vertical field based on substrate concentration caused by channel hot carrier (CHC) in addition to the drain induced avalanche hot carrier (DAHC) in the related art is added. Thus, wafer level reliability (WLR) is enhanced to detect an offset voltage shift failure related to the subsequent product level reliability (PLR). For example, according to the present disclosure, electron trap caused by a vertical field is alleviated by reducing the bulk concentration of the silicon substrate, thereby alleviating an offset voltage shift failure subsequent to the product level reliability (PLR) test.

Furthermore, in case of a high voltage PMOS element in a wafer level reliability detection method according to the present disclosure, only threshold voltage shift can be verified because of holes trapped in the gate oxide layer in a gate channel portion of transistor by negative bias temperature instability (NBTI) in the related art. However, the hot electron induced punch through (HEIP) 115 and CHC test 116 are added according to the present disclosure, thereby detecting a threshold voltage lowering problem causing an offset voltage shift failure, which is a failure due to threshold voltage (Vth) shift at high temperature operating lifetime (HTOL) which is product level reliability (PLR) caused due to electron trap in a liner silicon nitride layer, which is a thin silicon nitride film applied to alleviate stress between shallow trench isolation (STI), which is an isolation layer, and silicon bulk in advance during the process of wafer level reliability (WLR) test.

Accordingly, the operation of the present disclosure is assessed by a wafer level reliability (WLR) test method similar to the NBTI method in the related art, and carriers causing a threshold voltage shift are holes in case of NBTI. However, carriers causing the threshold voltage shift are electrons in case of HEIP, and thus the threshold voltage (Vth) shift is changed to a negative value. In this example, the determination criterion is based on failure criteria according to a predetermined change ratio to the reference (for example, about 10% changed negative or positive voltage shift), and the stress time is based on a predetermined period of time (for example, about 5120 seconds).

A trench is formed for element isolation on the semiconductor substrate, and a sidewall oxide layer 107 is formed on an inner surface of the trench. Subsequently, a silicon nitride layer is formed on a surface of the trench and semiconductor substrate 101 containing the sidewall oxide layer. At this time, the nitride layer is deposited using an LPCVD method to form a layer having tensile stress. Such tensile stress is created due to an LPCVD deposition condition. The deposited thickness is 50-200 Å. Then, the trench is filled with a gap-fill insulating layer such as an HDPCVD layer. In other words, the thin silicon nitride layer is an incomplete silicon nitride layer ($Si_3Nx$, x=1~4), and thus a problem of lowering the threshold voltage (Vth) of the PMOS element is created by electrons trapped in this site. As a result, the thickness of the sidewall oxide layer is increased from 200 Å to 400 Å, for example, subsequent to checking the HEIP test result, thereby alleviating the threshold voltage shift failure.

Accordingly, the hot electron induced punch through (HEIP) test item is added to the wafer level reliability (WLR) item, thereby enhancing the wafer level reliability (WLR).

As described above, in case of a low voltage PMOS element, it is seen that HCI lifetime (L/T) in the related art may be further reduced by implementing hot carrier injection (HCI) for the low voltage PMOS element, in case of low voltage and a core cell transistor which is and the channel length is a short channel.

Referring to FIG. 3, an example of the method for ensuring wafer level reliability may involve determining the type of semiconductor element to be formed, and determining the test items that are performed to ensure wafer level reliability.

Referring to FIG. 3, for example, to assess the element characteristics, a method for ensuring wafer level reliability may involve determining whether the semiconductor element is a PMOS element, NMOS element, as in 301, and whether the semiconductor element is a low-voltage PMOS element as in 302 or a high voltage NMOS element as in 303. In response to a determination that the semiconductor element is a low-voltage PMOS element, a PMOS HCI test 113 and NBTI test may be performed as in 311. In another example, for the low-voltage PMOS element, a NBTI test 112, a HEIP test 115, a CHC test 116, or a combination thereof, may be further performed. In response to a determination that the semiconductor element is a PMOS element, a NBTI test 112, a HEIP test 115, a CHC test 116, or a combination thereof, may be performed as in 312. In response to a determination that the semiconductor element is a high voltage NMOS element, a sub-HCI test, HCI test and CHC test may be formed as in 313. In response to a determination that the semiconductor element is a NMOS element, a NMOS HCI test 111 may be performed as in 314.

As illustrated in FIG. 4, it is seen that the additionally implemented PMOS HCI has a reduced lifetime in case of low voltage of about 1.2 V and a short channel (in case of a core cell) transistor compared to the NMOS HCI in the related art. In case of all low voltage transistors of (a) 1.2 V and (b) 2.5 V, it is seen that lifetime caused by channel hot carrier (CHC) is further reduced compared to the drain induced avalanche hot carrier (DAHC) in the related art.

Thus, according to the present disclosure, the PMOS HCI test item 113 is added to the low voltage element and short channel PMOS element, thereby enhancing wafer level reliability (WLR) test in the related art.

Furthermore, carriers accelerated in a substrate E-field are collected on a silicon/oxide layer ($Si/SiO_2$) interface, and the carriers that have received sufficient energy are emitted and trapped in the gate oxide layer by implementing substrate HCI for a high voltage NMOS element, thereby causing a problem of threshold voltage (i.e., an increased portion of threshold voltage). Referring to FIG. 5, for sub-HCI, threshold voltage (Vth) ratio (for example, less than about 2%) is a test criterion based on subsequent to a stress for a predetermined period of time (for example, about 10,000 seconds) with high temperature (for example, above 80° C.), the same or similar condition of gate and drain voltages, for example, a predetermined voltage less than the operating voltage (for example, Vs=½ Vop) to the source or a predetermined voltage (for example, Vs=0 V, Vb=negative bias) to bulk Si.

Furthermore, hot electron induced punch through (HEIP) is carried out for a high voltage PMOS. Thus, an increased leakage current caused due to the hot electron induced punch through (HEIP) causes a problem that electrons trapped between the trench sidewall and the liner silicon nitride layer decreases a threshold voltage (Vth) at a corner portion of transistor. Here, the implementation of HEIP is assessed on the same condition as negative bias temperature instability (NBTI) on the criterion of a predetermined voltage change rate (for example, less than about 10% decrease) for the threshold voltage (Vth) shift ratio.

As described above, in case of a low voltage element, the related art has been assessed only a threshold voltage (Vth) shift (i.e., threshold voltage increase) caused by trapping of major carriers (i.e., electrons) into the oxide layer at the drain and gate portions caused by a horizontal field only for an NMOS element to verify the threshold voltage (Vth) movement characteristics. However, as progressed the gate oxide layer having a low thickness of about 10-50 Å and short channel length smaller than 0.13 µm in length, this has an effect on the movement of the threshold voltage (Vth) caused by carrier trap on the entire gate channel. Accordingly, further reinforced wafer level reliability (WLR) test method can be established by adding a CHC test to be performed for the PMOS element according to the present disclosure.

For example, a threshold voltage shift occurs by trapped carriers caused by channel hot carrier (CHC) at a trap site inside the gate oxide layer over the entire channel of transistor by adding CHC test to the PMOS element and a NMOS element. Thus, it may be possible to detect the possibility of an offset shift failure which is a failure due to a threshold voltage shift in the following product level reliability (PLR) during the process of technology qualification by detecting a threshold voltage shift due to DAHC using the existing NMOS HCI test item, and detecting a threshold voltage shift due to carrier trap on the entire surface of transistor due to CHC using PMOS HCI which is a wafer level reliability (WLR) testing scheme in the present disclosure.

Furthermore, in case of a high voltage NMOS element, normal HCI test verifying only element degradation due to a horizontal field of transistor is carried out in case of the existing HCI by adding a sub-HCI test item to the wafer level reliability (WLR) test method. However, in the present disclosure, a threshold voltage shift based on silicon substrate body and interface state can be verified during the process of wafer level reliability (WLR) test by verifying transistor degradation due to a vertical field during the process of wafer level reliability (WLR) test, thereby detecting an offset voltage failure which is a failure due to a threshold voltage shift in the hot temperature operating lifetime (HTOL) test which is a process of the following product level reliability (PLR) during the process of the wafer level reliability (WLR) technology qualification.

Furthermore, in case of a high voltage PMOS element, since it has been impossible to secure a scheme associated with a preliminary detection method for the occurrence of a threshold voltage shift failure subsequent to the following product level reliability (PLR) HTOL in case of the related art, threshold voltage lowering due to such electrons during the process of wafer level reliability (WLR) technology qualification according to the present disclosure is detected, thereby coping with a problem of threshold voltage shift of the following product level reliability (PLR) in advance.

Accordingly, an object of the present disclosure is to provide a method of ensuring wafer level reliability in which PMOS HCI test, which is a test item associated with the following product level reliability (PLR) in case of a low voltage PMOS element, and a sub HCI test item for assessing a vertical field characteristic based on bulk concentration in case of a high voltage NMOS element are assessed, thereby detecting the following offset voltage shift failure in advance.

Furthermore, another object of the present disclosure is to provide a method for ensuring wafer level reliability in which a hot electron induced punch through (HEIP) test item is additionally assessed in case of a high voltage PMOS element, thereby detecting a decrease of threshold voltage caused by electron trap at a liner silicon nitride thin film which is a stress relaxing layer existing between an isolation layer of the high voltage PMOS element and silicon bulk in advance.

In order to accomplish the foregoing objects, a method of ensuring wafer level reliability according to the present disclosure may include the steps of assessing hot carrier injection (HCI); assessing negative bias temperature instability (NBTI); assessing substrate hot carrier injection (sub-HCI); assessing hot electron induced punch through (HEIP); assessing gate oxide integrity (GOI) and time dependent dielectric breakdown (TDDB) to assess gate oxide quality, and assessing electron-migration (EM) to assess metal wiring characteristics.

A method of ensuring wafer level reliability according to the present disclosure has the following effects.

According to a method of ensuring wafer level reliability in accordance with the present disclosure, PMOS HCI which is an item associated with the following product level reliability (PLR) in case of a low voltage PMOS element, and a sub HCI item for assessing a vertical field characteristic based on bulk concentration in case of a high voltage NMOS element are assessed, thereby detecting the following offset voltage shift failure in advance.

Furthermore, according to a method of ensuring wafer level reliability in accordance with the present disclosure, a hot electron induced punch through (HEIP) item is additionally assessed in case of a high voltage PMOS element, thereby detecting a decrease of threshold voltage caused by electron trap at a liner silicon nitride thin film which is a stress relaxing layer existing between an isolation layer of the high voltage PMOS element and silicon bulk in advance.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method for ensuring wafer level reliability, the method comprising:
    forming a gate oxide layer having a thickness of less than 50 Å on a semiconductor substrate;
    forming a PMOS element having a channel length of less than 0.13 µm on the semiconductor substrate;
    forming a high voltage NMOS element on a semiconductor substrate;
    assessing substrate hot carrier injection (sub-HCI) for the high voltage NMOS element; and
    assessing hot carrier injection (HCI) for the PMOS element.

2. The method of claim 1, wherein a condition of gate and drain voltages satisfy an equation, Vg=Vd=Vop, during the process of assessing hot carrier injection (HCI), wherein Vg is gate voltage, Vd is drain voltage, and Vop is operating voltage.

3. The method of claim 1, wherein a source voltage satisfies an equation, Vs=Vb, wherein Vs is source voltage, and Vb is bulk voltage.

4. The method of claim 1, wherein a criterion for determining a reliability lifetime (L/T) in the HCI test is 0.2 year.

5. The method of claim wherein the assessing of the sub-HCI is implemented at a condition of gate and drain voltages satisfying an equation, Vg=Vd=Vop, wherein Vg is gate voltage, Vd is drain voltage, and Vop is operating voltage.

6. The method of claim 1, wherein a predetermined voltage of less than the operating voltage is applied to a source to reduce a potential difference to a drain, wherein Vs=½ Vop, Vs is source voltage, and Vop is operating voltage.

7. The method of claim 1, wherein a predetermined source voltage of 0 V and a predetermined bulk voltage that is equal to negative bias are applied to bulk silicon (Si) to enhance a vertical field effect to the gate and bulk.

8. The method of claim 1, wherein a threshold voltage (Vth) shift ratio of less than 2% is used as a test criterion on the basis of subsequent to stress for a predetermined period of time.

9. The method of claim 1, wherein the high voltage NMOS element has an operating voltage of 10-40 V.

10. The method of claim 1, wherein the PMOS element has an operating voltage of 1-5 V.

* * * * *